United States Patent
Cheng et al.

(10) Patent No.: US 9,048,287 B1
(45) Date of Patent: Jun. 2, 2015

(54) MECHANISMS FOR FORMING SEMICONDUCTOR DEVICE STRUCTURE WITH FLOATING SPACER

(71) Applicant: Taiwan Semiconductor Manufacturing Co., Ltd., Hsin-Chu (TW)

(72) Inventors: Kuo-Yu Cheng, Tainan (TW); Wei-Kung Tsai, Tainan (TW); Kuan-Chi Tsai, Kaohsiung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/081,624

(22) Filed: Nov. 15, 2013

(51) Int. Cl.
| | |
|---|---|
| *H01L 27/12* | (2006.01) |
| *H01L 21/762* | (2006.01) |
| *H01L 29/66* | (2006.01) |
| *H01L 29/78* | (2006.01) |
| *H01L 21/768* | (2006.01) |
| *H01L 21/8234* | (2006.01) |
| *H01L 21/8238* | (2006.01) |

(52) U.S. Cl.
CPC ........ *H01L 21/7624* (2013.01); *H01L 29/6656* (2013.01); *H01L 29/7841* (2013.01); *H01L 21/76829* (2013.01); *H01L 21/823468* (2013.01); *H01L 21/823864* (2013.01); *H01L 29/6653* (2013.01)

(58) Field of Classification Search
CPC ................. H01L 21/76829; H01L 21/823468; H01L 21/823864; H01L 29/6653; H01L 29/6656
USPC ......................................................... 257/347
See application file for complete search history.

(56) References Cited

U.S. PATENT DOCUMENTS

| | | | | |
|---|---|---|---|---|
| 5,039,621 | A * | 8/1991 | Pollack ......................... | 438/164 |
| 2006/0003520 | A1* | 1/2006 | Huang et al. .................. | 438/222 |
| 2008/0272438 | A1* | 11/2008 | Doris et al. ................... | 257/369 |
| 2009/0032766 | A1* | 2/2009 | Rajaratnam et al. ......... | 252/79.1 |
| 2009/0075441 | A1* | 3/2009 | Chou et al. ................... | 438/197 |
| 2013/0157432 | A1* | 6/2013 | Beyer et al. .................. | 438/299 |
| 2014/0087535 | A1* | 3/2014 | Roh et al. ..................... | 438/285 |

FOREIGN PATENT DOCUMENTS

KR    10-0780651    * 11/2007

* cited by examiner

*Primary Examiner* — A. Sefer
(74) *Attorney, Agent, or Firm* — Birch, Stewart, Kolasch & Birch, LLP

(57) ABSTRACT

Embodiments of mechanisms for forming a semiconductor device structure with floating spacers are provided. The semiconductor device structure includes a silicon-on-insulator (SOI) substrate and a gate stack formed on the SOI substrate. The semiconductor device structure also includes gate spacers formed on sidewalls of the gate stack. The gate spacers include a floating spacer. The semiconductor device structure further includes a contact etch stop layer formed on the gate stack and the gate spacers. The contact etch stop layer is formed between the floating spacer and the SOI substrate.

17 Claims, 5 Drawing Sheets

MECHANISMS FOR FORMING SEMICONDUCTOR DEVICE STRUCTURE WITH FLOATING SPACER

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The implementation of silicon-on-insulator (SOI) technology is one of several manufacturing strategies employed to allow the continued miniaturization of microelectronic devices, which may be referred to as extending Moore's Law. Reported benefits of SOI technology relative to silicon (bulk complementary metal-oxide-semiconductor (CMOS)) processing may include, for example, lower parasitic capacitance due to isolation from the bulk silicon, which improves power consumption at matched performance, and resistance to latch-up due to isolation of the n- and p-well structures.

From a manufacturing perspective, SOI substrates are compatible with most fabrication processes. Indeed, an SOI-based process may be implemented without special equipment or significant retooling of an existing factory. However, there are many challenges related to forming semiconductor device structures on the SOI substrate.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
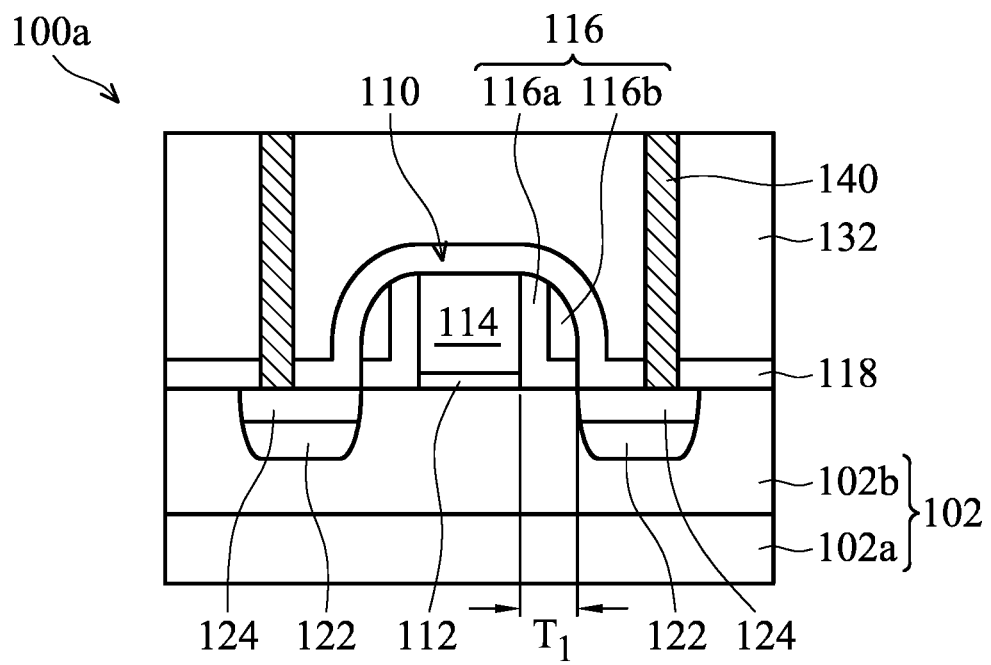
FIG. 1 shows a cross-sectional representation of a semiconductor device structure, in accordance with some embodiments of the disclosure.

Embodiments of mechanisms for forming a semiconductor device structure with floating spacers are provided. FIG. 1 shows a cross-sectional representation of a semiconductor device structure 100a in accordance with some embodiments of the disclosure.

Referring to FIG. 1, a substrate 102 is provided. Substrate 102 includes an insulating layer 102a and a semiconductor layer 102b. In some embodiments, insulating layer 102a is an oxide layer, such as silicon oxide layer. In some embodiments, semiconductor layer 102b is a silicon layer. In some embodiments, substrate 102 is a silicon-on-insulator (SOI) substrate.

As shown in FIG. 1, a gate stack 110 is formed on substrate 102. Gate stack 110 includes a gate dielectric layer 112 and a gate electrode layer 114. Gate spacers 116 are formed on the sidewall of gate stack 110. Gate spacers 116 include a first layer 116a and a second layer 116b. In some embodiments, first layer 116a is an oxide layer and second layer 116b is a nitride layer.

In some embodiments, gate spacers 116 have a thickness $T_1$ in a range from about 5 nm to about 100 nm. In other words, a sum of the thickness of first layer 116a and the thickness of second layer 116b is in a range from about 5 nm to about 100 nm.

Source/drain regions 122 are formed in substrate 102. Silicide regions 124 are formed in substrate 102 and on source/drain regions 122. Contact etch stop layer (CESL) 118 is conformally formed on gate stack 110 and gate spacers 116. In some embodiments, Contact etch stop layer 118 is made of silicon nitride.

As shown in FIG. 1, inter-dielectric (ILD) layer 132 on contact etch stop layer 118. Contact structures 140 are formed in ILD layer 132 and contact silicide regions 124. Contact structures 140 are made of conductive materials, such as copper, or copper alloy.

In some embodiments, contact etch stop layer 118 is a high-stress layer which is used to increase the carrier mobility in a channel region below gate stack 110. Therefore, the operation speed of semiconductor device structure 100a is increased. As shown in FIG. 1, a distance between contact etch stop layer 118 and the channel region below gate stack 110 is limited to the thickness $T_1$ of gate spacers 116. However, the operation speed of semiconductor device structure 100a does not meet higher speed requirements. Therefore, some embodiments are provided.

FIGS. 2A-2G show cross-sectional representations of various stages of forming a semiconductor device structure 100b, in accordance with some embodiments of the disclosure. However, it should be noted that FIGS. 2A to 2G have been simplified for the sake of clarity to better understand the inventive concepts of the disclosure. Additional features can be added in semiconductor device structure 100b, and some of the features below can be replaced or eliminated.

Figure 2A:
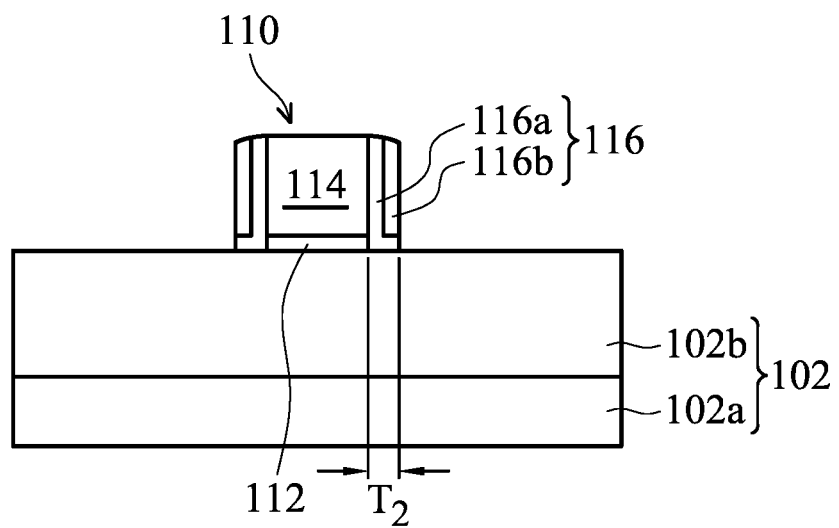
FIGS. 2A-2G show cross-sectional representations of various stages of forming a semiconductor device structure with floating spacers, in accordance with some embodiments of the disclosure.

Referring to FIG. 2A, substrate 102 is provided. Substrate 102 includes insulating layer 102a and semiconductor layer 102b. In some embodiments, insulating layer 102a is an oxide layer, such as silicon oxide layer. In some embodiments, semiconductor layer 102b is a silicon layer. In some embodiments, substrate 102 is a silicon-on-insulator (SOI) substrate.

Substrate 102 may further include isolation features (not shown), such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements, are formed in and/or on substrate 102.

As shown in FIG. 2A, gate stack 110 is formed on substrate 102. Gate stack 110 includes gate dielectric layer 112 and gate electrode layer 114. Gate dielectric layer 112 is formed on substrate 102. Gate dielectric layer 112 may be made of silicon oxide, silicon oxynitride, or a high dielectric constant material (high-k material). The high dielectric constant material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or other applicable high-k dielectric materials. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or other applicable materials. Gate dielectric layer 112 may be formed by atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or other applicable processes.

Afterwards, gate electrode layer 114, such as a polysilicon layer, is formed on gate dielectric layer 112. In some embodiments, gate electrode layer 114 is formed by a CVD process or other applicable processes.

Afterwards, gate dielectric layer 112 and gate electrode layer 114 are patterned by a photolithography process and an etching process. The photolithography process includes the processing steps of photoresist coating, soft baking, mask aligning, exposing, post-exposure baking, developing photoresist and hard baking. The etching process includes a wet etching process or a dry etching process. Gate stack 110 may include other layers, for example, capping layers, interface layers, diffusion layers, barrier layers.

As shown in FIG. 2A, first gate spacers 116 are formed on the sidewalls of gate stack 110. First spacers 116 include first layer 116a and second layer 116b. First layer 116a and second layer 116b are independently made of silicon oxide, silicon nitride, silicon oxynitride, or applicable materials. In some embodiments, first layer 116a is an oxide layer and second layer 116b is a nitride layer. In some embodiments, a dielectric layer is deposited over semiconductor substrate 102, and an etching process is performed to remove a portion of the dielectric layer to form gate spacers 116. In some embodiments, gate spacers 116 have a thickness $T_2$ in a range from about 5 nm to about 50 nm. In some embodiments, the thickness $T_2$ in FIG. 2A is smaller than the thickness $T_1$ in FIG. 1.

Figure 2B:
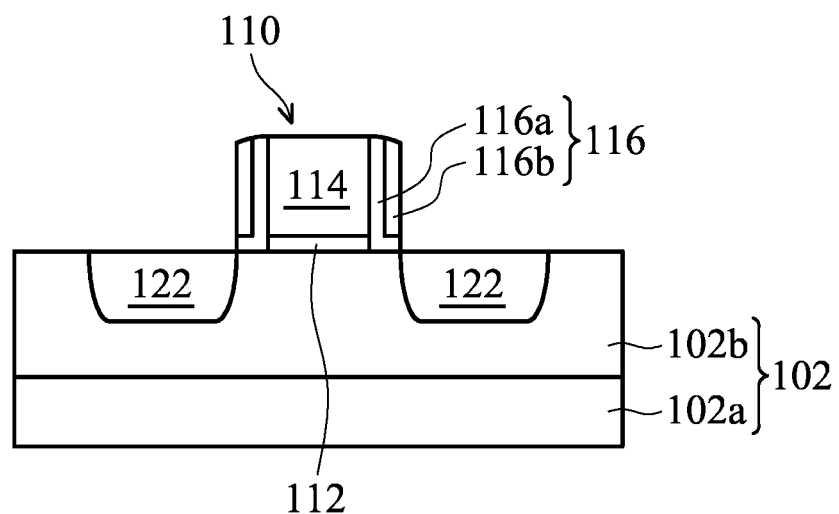

After first gate spacers 116 are formed, source/drain regions 122 are formed as shown in FIG. 2B in accordance with some embodiments of the disclosure. A doping process is performed to form source/drain regions 122 in substrate 102. In some embodiments, source/drain regions 122 are doped with an n-type dopant, such as arsenic (As), phosphorous (P) or antimony (Sb). In some other embodiments, source/drain regions 122 are doped with a p-type dopant, such as boron (B) or boron fluorine ($BF_2$). The doping process may be achieved by an ion implantation process, plasma immersion ion implantation (PIII) process, gas and/or solid source diffusion process, or other suitable process. Source/drain regions 122 may further be exposed to annealing processes, such as a rapid thermal annealing process.

Figure 2C:
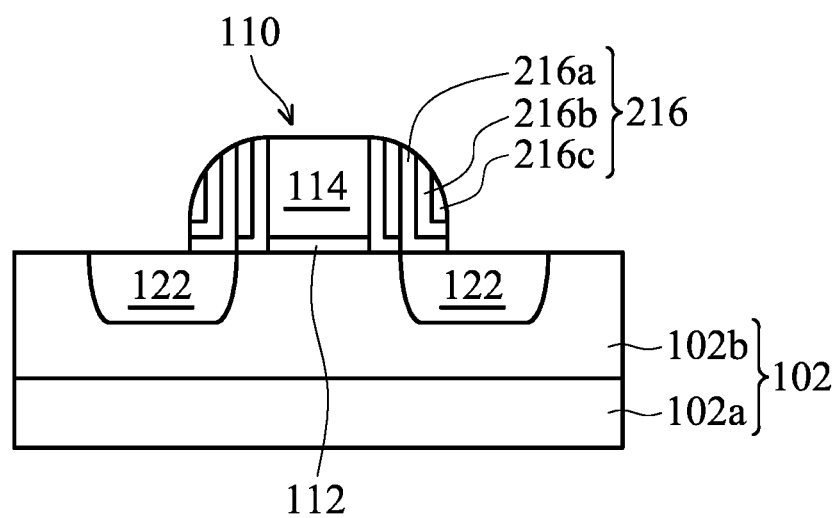

After source/drain regions 122 are formed, second gate spacer 216 are formed on first gate spacers 116 as shown in FIG. 2C in accordance with some embodiments of the disclosure. Second gate spacers 216 include a first layer 216a, a second layer 216b and a third layer 216c. In some embodiments, first layer 216a is an oxide layer, second layer 216b is a nitride layer, and third layer 216c is another oxide layer. In some embodiments, first layer 216a and third layer 216c both are made of silicon oxide. In some embodiments, second layer 216b is made of silicon nitride, or silicon oxynitride.

Figure 2D:
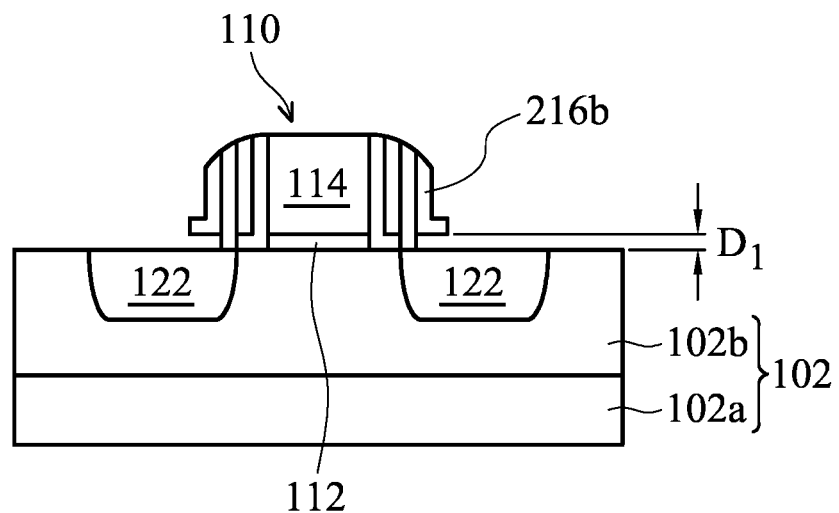
Figure 3:
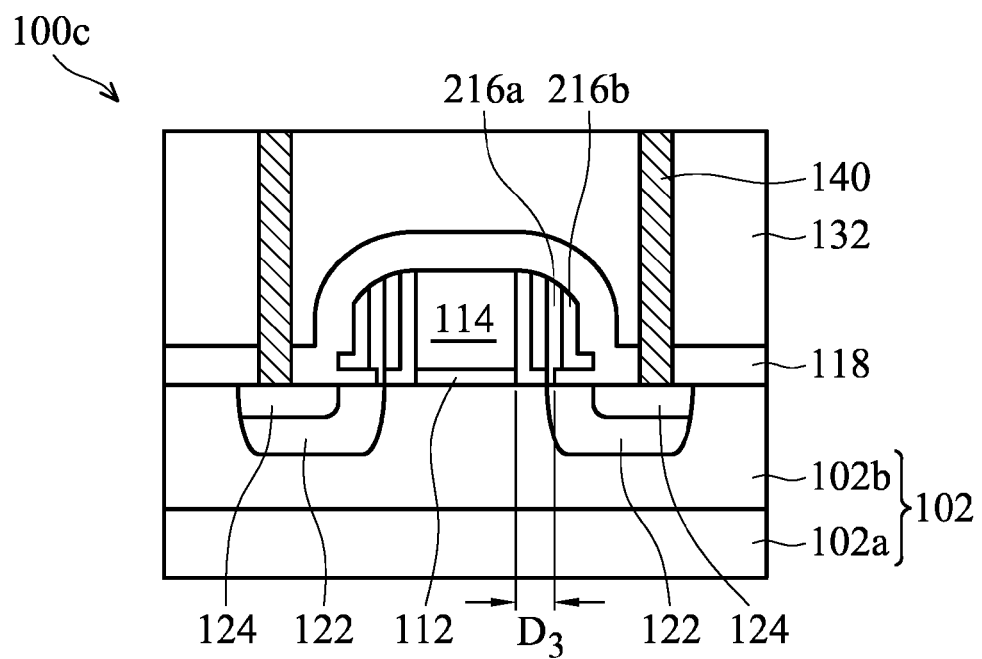
FIG. 3 shows a cross-sectional representation of a semiconductor device structure with floating spacers, in accordance with some embodiments of the disclosure.

After second gate spacers 216 are formed, a removing process is performed to form a floating spacer 216b as shown in FIG. 2D in accordance with some embodiments of the disclosure. The removing process is used to remove a portion of third layer 216c and a portion of first layer 216a. In some embodiments, the removing process is a wet dip process. Because third layer 216c and first layer 216a of second gate spacers 216 are made of oxide layer and second layer 216b is made of nitride, the removing process with high selectivity to oxide and nitride is performed. In some embodiments, an etching selectivity of oxide to nitride is in a range from about 10/1 to about 5/1. In some other embodiments, as shown in FIG. 3 (described detail later), a portion of first layer 116a of first gate spacers 116 is also removed.

It should be noted that a portion of first layer 216a of second gate spacers 216 is removed. A space between substrate 102 and second layer 216b is formed. Second layer 216b only contacts with first layer 216a of second gate spacers 216, but does not physically contact substrate 102. Therefore, second layer 216b is hereafter called as a floating spacer.

In some embodiments, floating spacer 216b is a L-shape layer or L-shape like layer. The horizontal portion of L-shape layer does not directly contact substrate 102 or source/drain regions 122. In some embodiments, a distance $D_1$ between floating spacer 216b and substrate 102 is in a range from about 1 nm to about 30 nm.

Figure 2E:
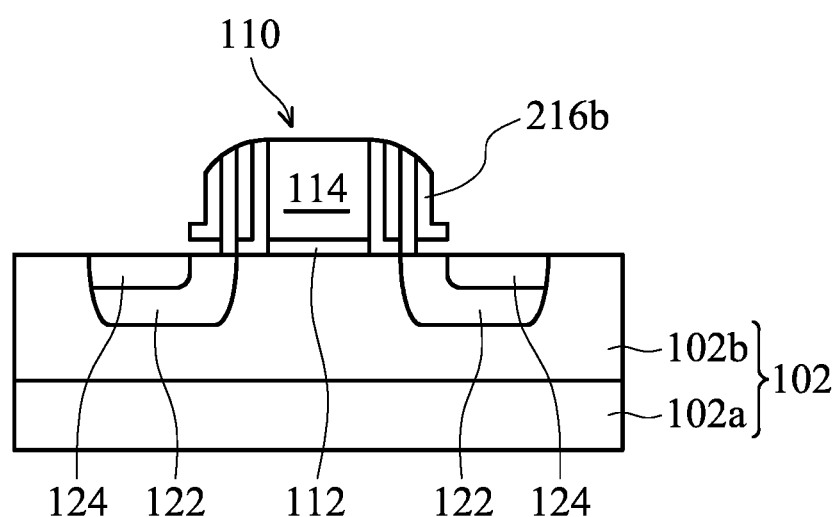

After floating spacer 216b is formed, silicide regions 124 are formed in SOI substrate 102 and on source/drain regions 122 as shown in FIG. 2E in accordance with some embodiments of the disclosure.

In some embodiments, a salicidation (self-aligned silicidation) process is performed to form silicide regions 124 on source/drain regions 122. For example, a metal film, such as cobalt, platinum, manganese, palladium, is deposited on substrate 102 to be in direct contact with the exposed silicon surface, such as surfaces of source/drain regions 122. Any suitable process, such as a PVD process, CVD process, plating process, electroless plating process, and/or the like, may be performed to form the metal film. A heating operation is then carried out to cause a reaction between the deposited metal film and the exposed silicon surface, thus forming silicide regions 124. The un-reacted portion of the deposited metal film is then removed, for example, by using an etching process. Silicide regions 124 may protrude from the original surface of the exposed silicon surface. Silicide regions 124 have lower resistance than non-silicided regions, especially in smaller geometries.

Figure 2F:
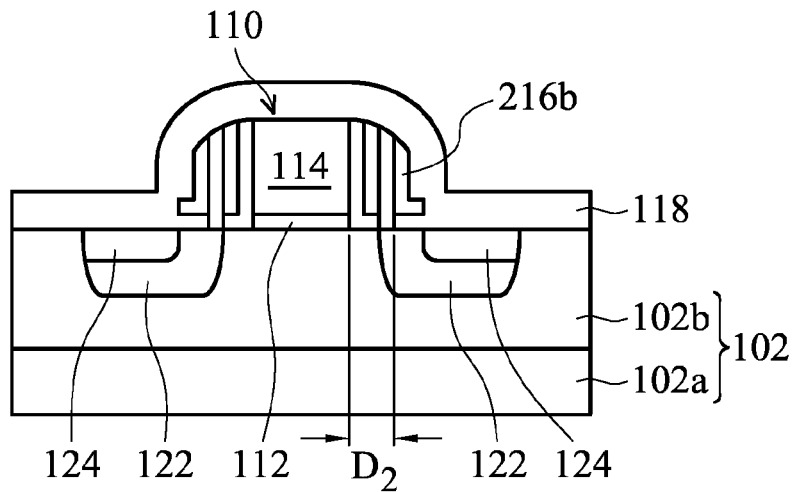

After silicide regions 124 are formed, contact etch stop layer 118 is conformally formed on gate stack 110, second gate spacers 216 and substrate 102 as shown in FIG. 2F in accordance with some embodiments of the disclosure. In some embodiments, contact etch stop layer 118 is a high stress dielectric layer. In some embodiments, contact etch stop layer 118 which is in NMOS device region, has a tensile stress, while contact etch stop layer 118, which is in PMOS device region, has a compressive stress.

In some embodiments, contact etch stop layer 118 is made of oxide, nitride, oxynitride, silicon oxycarbide, silicon carbide, or applicable materials. In some embodiments, contact etch stop layer 118 is formed by a chemical vapor deposition (CVD) process. In some embodiments, contact etch stop layer 118 has a thickness in a range from 1 nm to about 300 nm.

It should be noted that there is a space between floating spacer 216b and substrate 102. When contact etch stop layer 118 is deposited, the space is filled with contact etch stop layer 118.

As mentioned above, contact etch stop layer 118 serves as a stressor layer to improve the carrier mobility in a channel region below gate stack 110. Therefore, the operation speed of semiconductor device structure 100a is increased. In some embodiments, a shortest distance $D_2$ between contact etch stop layer 118 and the channel region below gate stack 110 is in a range from 5 nm to about 100 nm.

As shown in FIG. 1, the distance between contact etch stop layer 118 and the channel region below gate stack 110 is limited to the thickness $T_1$ of gate spacers 116. Distance $D_2$ in FIG. 2F is smaller than thickness $T_1$ in FIG. 1. Therefore, compared with contact etch stop layer 118 in FIG. 1, contact etch stop layer 118 in FIG. 2F is closer to the channel region below gate stack 110 due to the formation of floating spacer 216b. In other words, because floating spacer 216b is formed, contact etch stop layer 118 efficiently supplies stresses to the channel region of semiconductor device structure 100b (as shown in FIG. 2G).

Figure 2G:
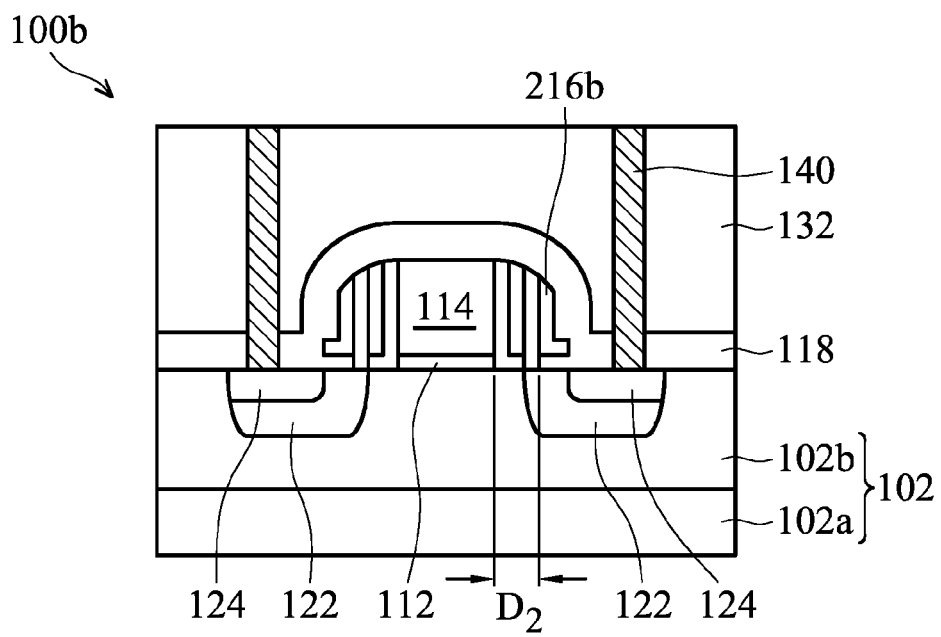

After contact etch stop layer 118 is formed, inter-dielectric (ILD) layer 132 is formed on substrate 102 as shown in FIG. 2G in accordance with some embodiments of the disclosure. More specifically, ILD layer 132 is formed on contact etch stop layer 118.

ILD layer 132 is made of silicon oxide, doped or undoped silicon oxide, undoped silicate glass (USG), phosphorus-doped silicon glass (PSG), boron phosphorus silicate glass (BPSG), phenyl triethoxy silicate (PTEOS) or boron phosphorous tetraethyl silicate (BPTEOS). ILD 132 is formed by a chemical vapor deposition (CVD) process, high-density plasma CVD process (HDP CVD), spin coating or deposition furnace. In some embodiments, ILD layer 132 is made of low-k dielectric layer having a low dielectric constant, for example, less than about 3.5.

Afterwards, contact openings (not shown) are formed in ILD layer 132 to expose silicide regions 124. The contact openings are formed by an etching process. Afterwards, conductive materials are filled into the contact openings to form contact structures 140. The conductive materials include tungsten, copper, aluminum, gold, platinum, nickel, titanium, other applicable materials. In some embodiments, a diffusion barrier layer, such as Ta, TaN, Ti, TiN, or CoW, is formed before the conductive materials are filled into the contact openings. Additional processes may be performed to complete the fabricating steps of semiconductor device 100b.

FIG. 3 shows a cross-sectional representation of a semiconductor device structure 100c, in accordance with some embodiments of the disclosure.

FIG. 3 is similar to FIG. 2G, the difference between FIG. 3 and FIG. 2G is that first layer 216a of second gate spacer 216 below second layer 216a is over-etched in FIG. 2F. As a result, a shortest distance $D_3$ between contact etch stop layer 118 and the channel region below gate stack 110 is in a range from 1 nm to about 100 nm. The distance $D_3$ in FIG. 3 is smaller than the distance $D_2$ in FIG. 2G. Therefore, the operation speed of semiconductor device 100c in FIG. 3 is higher than that of semiconductor device 100b in FIG. 2G.

Embodiments of mechanisms for forming semiconductor device structure with floating spacers are provided. The floating spacers are formed on sidewalls of a gate stack to form a space between a substrate and the floating spacers. As a result, a contact etch stop layer is filled into the space, and the contact etch stop layer is closer to a channel region below the gate stack. Therefore, the operation speed of the semiconductor device structure is increased.

In some embodiments, a semiconductor device structure is provided. The semiconductor device structure includes a silicon-on-insulator (SOI) substrate and a gate stack formed on the SOI substrate. The semiconductor device structure also includes gate spacers formed on sidewalls of the gate stack. The gate spacers include a floating spacer. The semiconductor device structure further includes a contact etch stop layer formed on the gate stack and the gate spacers. The contact etch stop layer is formed between the floating spacer and the SOI substrate.

In some embodiments, a semiconductor device structure is provided. The semiconductor device structure includes a silicon-on-insulator (SOI) substrate and a gate stack formed on the SOI substrate. The semiconductor device structure also includes first gate spacers formed on sidewalls of the gate stack and second gate spacers formed on the first gate spacers. The semiconductor device structure further includes a contact etch stop layer formed on the gate stack and the second gate spacer. The contact etch stop layer is formed between the second gate spacer and the SOI substrate.

In some embodiments, a method for forming a semiconductor device structure is provided. The method includes providing a silicon-on-insulator (SOI) substrate and forming a gate stack on the SOI substrate. The method further includes forming gate spacers on sidewalls of the gate stack. The gate spacers comprise a floating spacer. The method further includes forming a contact etch stop layer on the gate stack and the gate spacers. The contact etch stop layer is formed between the floating spacer and the SOI substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device structure, comprising:
a silicon-on-insulator (SOI) substrate;
a gate stack formed on the SOI substrate;
gate spacers formed on sidewalls of the gate stack, wherein the gate spacers comprise a floating spacer, wherein the gate spacers comprise:
a first oxide layer formed on the sidewalls of the gate stack;
a first nitride layer formed on the first oxide layer;
a second oxide layer formed on the first nitride layer; and
the floating spacer formed on the second oxide layer; and
a contact etch stop layer comprises a first portion and a second portion, wherein the first portion is formed on the gate stack and the gate spacers, and the second portion is formed between the floating spacer and the SOI substrate.

2. The semiconductor device structure as claimed in claim 1, wherein a sum of a thickness of the first oxide layer and a thickness of the first nitride layer is in a range from about 5 nm to about 100 nm.

3. The semiconductor device structure as claimed in claim 1, wherein a distance between the floating spacer and the SOI substrate is in a range from about 1 nm to about 30 nm.

4. The semiconductor device structure as claimed in claim 1, further comprising:
source/drain regions formed in the SOI substrate;
silicide regions formed in the SOI substrate and on the source/drain regions.

5. The semiconductor device structure as claimed in claim 4, further comprising:
a contact structure formed on the silicide regions.

6. The semiconductor device structure as claimed in claim 1, wherein the contact etch stop layer is a high stress dielectric layer.

7. The semiconductor device structure as claimed in claim 1, wherein the floating spacer comprises silicon nitride or silicon oxynitride.

8. The semiconductor device structure as claimed in claim 1, wherein the contact etch stop layer comprises oxide, nitride, oxynitride, silicon oxycarbide, or silicon carbide.

9. The semiconductor device structure as claimed in claim 1, wherein the floating spacer does not physically contact the SOI substrate.

10. A semiconductor device structure, comprising:
a silicon-on-insulator (SOI) substrate;
a gate stack formed on the SOI substrate;
first gate spacers formed on sidewalls of the gate stack, wherein the first gate spacers comprises a first oxide layer on the sidewalls of the gate stack and a first nitride on the first oxide layer;
second gate spacers formed on the first gate spacers, wherein the second gate spacers comprises a second oxide layer on the first nitride layer and a second nitride on the second oxide layer; and
a contact etch stop layer comprises a first portion and a second portion, wherein the first portion is formed on the gate stack and the second gate spacer, and the second portion is formed between the second gate spacer and the SOI substrate.

11. The semiconductor device structure as claimed in claim 10, wherein the nitride layer does not physically contact the SOI substrate.

12. The semiconductor device structure as claimed in claim 11, wherein a distance between the second nitride layer and the SOI substrate is in a range from about 1 nm to about 30 nm.

13. The semiconductor device structure as claimed in claim 10, wherein a thickness of the first gate spacers is in a range from about 5 nm to about 50 nm.

14. A method for forming a semiconductor device structure, comprising:
providing a silicon-on-insulator (SOI) substrate;
forming a gate stack on the SOI substrate;
forming gate spacers on sidewalls of the gate stack, wherein the gate spacers comprise a floating spacer, wherein forming the gate spacers comprises:
forming a first oxide layer on the sidewalls of the gate stack;
forming a first nitride layer on the first oxide layer;
forming a second oxide layer on the first nitride layer; and
forming the floating spacer on the second oxide layer; and
forming a first portion of a contact etch stop layer on the gate stack and the gate spacers, and forming a second portion of the contact etch stop layer between the floating spacer and the SOI substrate.

15. The method as claimed in claim 14, wherein forming the floating spacer on the second oxide layer comprises:
forming a second nitride layer on the second oxide layer;
forming a third oxide layer on the second nitride layer; and
removing the third oxide layer and a portion of second oxide layer to form a space between the second nitride layer and the SOI substrate.

16. The method as claimed in claim 14, further comprising:
forming source/drain regions in the SOI substrate;
forming silicide regions in the SOI substrate and on the source/drain regions.

17. The method as claimed in claim 16, further comprising:
forming an inter-dielectric (ILD) layer on the contact etch stop layer; and
forming a contact structure in the ILD layer, wherein the contact structure is formed on the silicide regions.

* * * * *